United States Patent [19]

Zarowin et al.

[11] Patent Number: 5,238,532
[45] Date of Patent: Aug. 24, 1993

[54] METHOD AND APPARATUS FOR REMOVAL OF SUBSURFACE DAMAGE IN SEMICONDUCTOR MATERIALS BY PLASMA ETCHING

[75] Inventors: Charles B. Zarowin, Rowayton; L. David Bollinger, Ridgefield, both of Conn.

[73] Assignee: Hughes Aircraft Company, Los Angeles, Calif.

[21] Appl. No.: 842,828

[22] Filed: Feb. 27, 1992

[51] Int. Cl.$^5$ .................... H01L 21/306; B44C 1/22
[52] U.S. Cl. .................... 156/643; 156/657; 156/662; 156/345; 134/1
[58] Field of Search .............. 156/643, 646, 657, 662, 156/345; 118/720, 723, 729, 50.1, 620; 427/38, 39; 134/1, 31, 32; 204/192.32, 192.37, 298.31, 298.33, 298.35

[56] References Cited

U.S. PATENT DOCUMENTS

| | | | |
|---|---|---|---|
| 3,943,047 | 3/1976 | Cruzan et al. | 204/298.35 X |
| 4,874,460 | 10/1989 | Nakagawa et al. | 204/298.33 X |
| 4,964,940 | 10/1990 | Auvert et al. | 156/345 |
| 5,009,738 | 4/1991 | Gruenwald et al. | 156/345 |
| 5,076,877 | 12/1991 | Ueda et al. | 204/298.33 X |

*Primary Examiner*—William A. Powell
*Attorney, Agent, or Firm*—Michael W. Sales; Wanda Denson-Low

[57] ABSTRACT

A high pressure plasma is used in conjunction with a plasma assisted chemical etching material removal tool 10 to rapidly remove subsurface damage from a substrate without mechanically contacting the surface and without introducing new microscopic or atomic damage to the substrate.

27 Claims, 2 Drawing Sheets

METHOD AND APPARATUS FOR REMOVAL OF SUBSURFACE DAMAGE IN SEMICONDUCTOR MATERIALS BY PLASMA ETCHING

FIELD OF THE INVENTION

The present invention relates to a method and apparatus for the removal of subsurface damage from semiconductor materials and, more, particularly to a method and apparatus utilizing plasma assisted chemical etching for rapid and controlled removal of subsurface damage from a semiconductor material. The method and apparatus of the present invention removes the subsurface damage layer, or other unwanted layers from a substrate, by plasma etching in a uniform manner so as to control the thickness of films and layers of the semiconductor material.

DESCRIPTION OF THE PRIOR ART

Semiconductor material surface finishing processes of the prior art presently rely on mechanical or chemical-mechanical material removal. Such processes leave some degree of microscopic subsurface damage because they involve mechanical contact with the surface. Such microscopic subsurface damage typically degrades the performance of high speed semiconductor devices. On the other hand, wet chemical etching removes material without creating subsurface damage, but, unfortunately the uniformity of material removal and finished surface smoothness is difficult to control.

The method and apparatus of the present invention utilizes a plasma assisted chemical etching removal tool to remove subsurface damage of a semiconductor. Such a tool has been generally disclosed in related U.S. patent application Ser. No. 07/696,897 entitled "System for Removing Material From A Wafer" filed on May 7, 1991, U.S. patent application Ser. No. 07/807,535 entitled "Method and Apparatus for Confinement of a Plasma Etch Region for Precision Shaping of Surfaces of Substrates and Films" filed on Dec. 13, 1991 and U.S. patent application Ser. No. 07/807,536, entitled "Method and Apparatus for Generating a Plasma for 'Downstream' Rapid Shaping of Surfaces of Substrates and Films" filed on Dec. 13, 1991. All these patent applications are commonly owned by the present assignee.

The method and apparatus of the present invention improves upon the prior art processes in that the removal of subsurface damage occurs with no mechanical contact between the removal tool and the surface and therefore, it does not introduce new subsurface damage. Also, the plasma regime used in the method of the present invention has very low ion energies, thus, providing a removal process that does not create subsurface damage either on the microscopic scale (e.g., microcracks caused by physical abrasion of the surface) or on the atomic scale (e.g., crystal dislocations, or implanted contaminants).

SUMMARY OF THE INVENTION

The method and apparatus of the present invention provides a material removal tool which can be used to remove layers of subsurface damage from a substrate. The method and apparatus utilizes a plasma assisted chemical etching reactor to place reactive plasma species in contact with the substrate surface where damage is to be removed. By forming the plasma in a relatively high pressure regime where the ion energy bombardment is low and the removal mechanism is primarily chemical, the method and apparatus of the present invention can remove the subsurface damage without introducing new damage to the substrate on either the microscopic scale or the atomic scale.

One objective of the present invention is to provide a material removal process which removes microscopic and atomic scale subsurface damage of a substrate.

Another objective of the present invention is to provide a material removal process which can controllably remove a layer of unwanted material such as an upper dopant layer in silicon to expose a layer with a desired dopant density profile.

Another objective of the present invention is to provide a material removal process which can remove a surface layer very uniformly.

Another objective of the present invention is to provide a material removal process which can remove a layer to a prescribed thickness profile.

Other objects and advantages of the present invention will become apparent to those skilled in the art from the following detailed description read in conjunction with the attached drawings and claims appended hereto.

DETAILED DESCRIPTION OF THE PRESENT INVENTION

Figure 1:
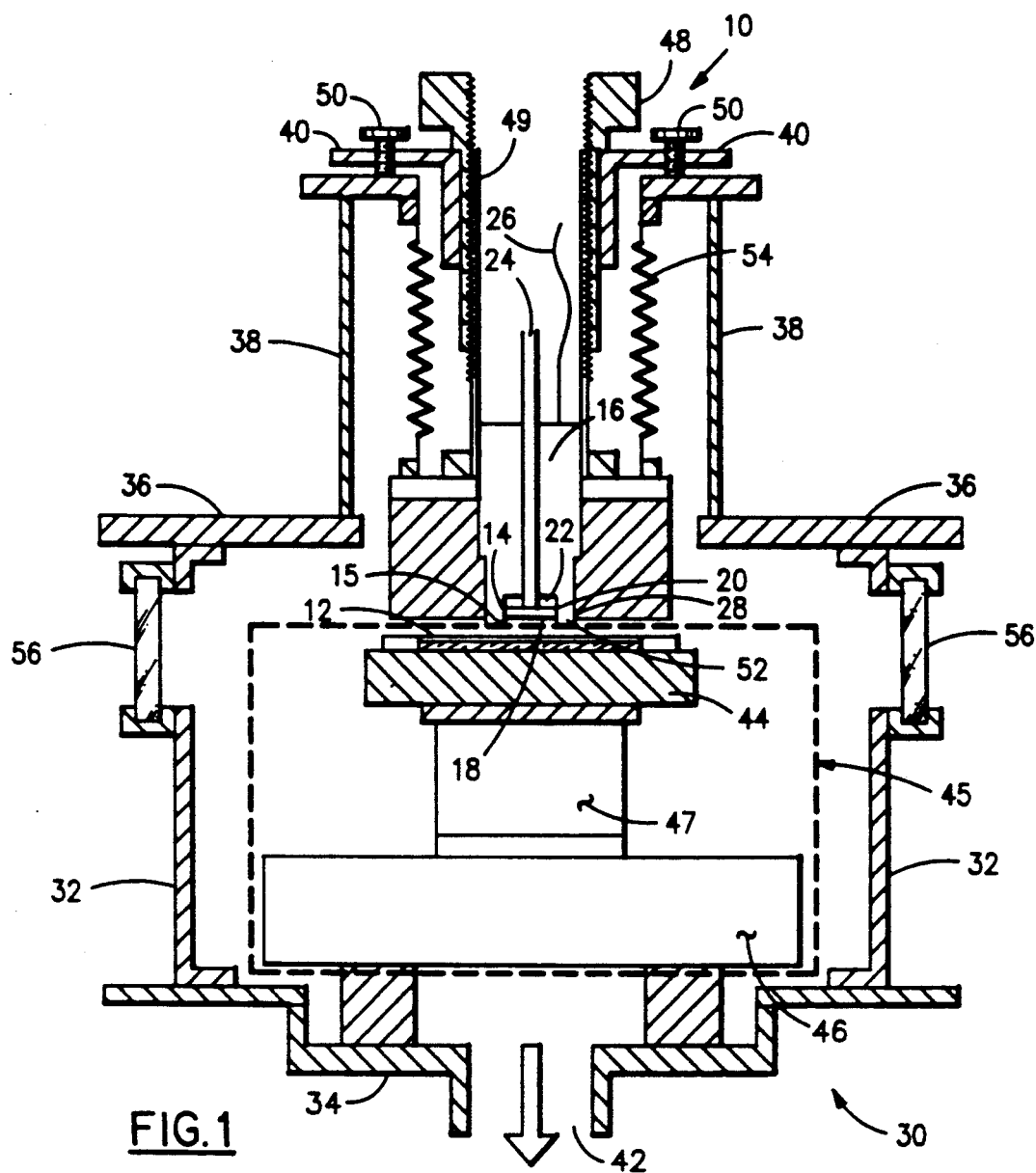
FIG. 1 is a schematic diagram of a reactor system capable of confining a plasma etch region to a local area on a substrate.

The method and apparatus of the present invention removes subsurface damage layers or other unwanted layers of semiconductor material by the application of reactive species of a plasma to the substrate by a plasma assisted chemical etching material removal reactor. FIG. 1 shows the plasma assisted chemical etching reactor used for subsurface damage removal of a substrate.

Referring to FIG. 1, the apparatus is designed so as to confine a plasma etch region over a substrate. It comprises a reactor 10 designed for transporting a process gas into a region over the surface of a substrate where an rf field is applied to disassociate the gas into reactive components. To accomplish this desired result, the reactor 10 has a plasma chamber 14 having walls 15 defined by a first dielectric insulator 16 and a ceiling 18 defined by a reactive gas diffuser 20. The plasma chamber 14 is the center of etching reactivity and thus, the first dielectric must be fabricated from a non-contaminating material. Above the chamber 14, an rf driven electrode 22 is affixed between the diffuser 20 and the first insulator 16. A process gas feed tube 24 running centrally through the first dielectric insulator 16 supplies reactive gas to the diffuser 20 in the plasma chamber 14 during the etching operation. An rf inlet conductor 26 connects the rf driven electrode 22 to an rf field power source. A second dielectric insulator 28 surrounds the first insulator 16 and is dimensioned so as to essentially cover substrate 12 so as to prevent plasma formation outside of chamber 14. The components of the reactor 10, are enclosed in a vacuum housing 30 comprising a first set of walls 32 extending from a base 34 to a mid-ceiling 36 and a second set of walls 38 extending to a top ceiling flange 40.

In an exemplary embodiment, the reactive gas diffuser 20 is electrically conductive and fabricated from porous silicon carbide, graphite, or the like. In the case of etching silicon the reactive gas has high negativity and may include sulfur hexafluoride or nitrogen trifluoride, or the like. During operation, a vacuum is applied through a vacuum outlet 42 at the bottom of the vacuum housing 30. The etchable substrate 12, located adjacently below the plasma chamber 14 during etching, is supported by a substrate holder 44 which also acts as a second electrode having its potential preferably at electrical ground. The substrate holder may also have a means (not shown) to control the temperature of the substrate thereon.

The substrate holder 44 is mounted to an apparatus 45 for two-dimensional translation which allows precise placement and dwell time for the localized etching reaction on the surface of the substrate 12. In one embodiment, the apparatus 45 includes an X-Y positioning table, shown in FIG. 1 at 46 and 47 as for example, the reference numeral 46 indicating the X direction track and the reference numeral 47 indicating the Y direction track of travel and wherein the X and Y directions are orthogonal. The reactor 10 has a threaded tube 48 connected to a reactor support means 49 which interfaces with the threaded tube. The tube 48 may be rotated in a clockwise or counter clockwise fashion so as to allow adjustment of the distance between the plasma chamber 14 and the surface of the substrate 12. In the embodiment illustrated, the distance between the plasma chamber and the substrate may be adjusted in the approximate range of 1 to 10 mm.

The reactor also has kinematic mounting means having three screws 50 equally spaced on a circle, each of which nest into a V-groove (not shown) on the top ceiling flange 40. This mounting means allows adjustment of the angle of the terminal end 52 of the plasma chamber with respect to the surface of the substrate 12. While the present embodiment described above provides a means for positioning the plasma chamber 14 with respect to the surface of the substrate 12, other adaptations such as permanently fixing the plasma chamber assembly and providing three-dimensional and multi-angular positioning of the substrate by a three-dimensional and multi-angular translation stages may be readily substituted. In fact, one preferred embodiment has a fixed reactor configuration so that the rf power, gas and coolant to the plasma reactor can be easily interfaced at atmosphere.

The reactor system further comprises a bellows 54 attached between the ceiling flange 40 of the vacuum housing 30 and the second dielectric insulator 28 so as to provide a means for vacuum sealing the reactor 10 while the plasma chamber assembly is allowed relative movement within the reactor. A plurality of viewports 56 are provided for observation of the reaction.

The method and apparatus of the present invention utilizes a plasma parameter regime that limits ion bombardment of the substrate to only low energy ions (less than 10 eV) so as to prevent atomic scale damage during removal of previously existing subsurface damage. Atomic scale damage from plasma assisted chemical etching occurs when ion energies approach the sputtering threshold of the material being etched (approximately 50 eV). Ion energies well above 50 eV are common to many plasma etch processes and are the basis for material removal by ion beam sputter etching. In fact, it is well known that when etching semiconductor device patterns defined by a microlithographic process, critical surfaces cannot be exposed to ion energies greater than 50 eV without degrading the performance of the device. Thus, by limiting the ion energies below 10 eV, the method and apparatus of the present invention can be used to remove microscopic and atomic scale subsurface damage by controllably removing a layer of unwanted material uniformly or by removing material from the surface to a prescribed thickness profile.

Thus, existing subsurface damage of a semiconductor material is removed and further subsurface damage is avoided by ensuring that the plasma used in the present invention limits ion energy bombardment of the substrate surface and also ensuring that the etching species generated have a high density at the etching surface to yield high removal rates. Subsurface damage material removal with low ion energy bombardment can be ensured by using a plasma that produces a material removal mechanism which is primarily chemical.

Primarily chemical removal mechanisms generate reactive species which chemically interact with the substrate surface to form volatile by-products. The present invention achieves such a mechanism by using a high pressure (greater than 1 Torr) plasma regime in the plasma assisted chemical etching tool. The chemical material removal mechanism resulting from use of a high pressure plasma occurs because the removal mechanism of the plasma reactive species is collision dominated and, thus, the ion energy of this mechanism is limited to several electron volts. Although the ion energy is low with the method and apparatus of the present invention, the chemical reaction rate is accelerated by the very low energy ions and excited neutral species which by themselves could not remove material. In addition to ensuring a collision dominated removal mechanism through the use of a high pressure plasma regime, the use of a high pressure plasma also generates a beneficial higher density of reactive species at the active etching site. The benefit of a higher density of reactive species is the increase in the material removal rate at the etching site.

Figure 2A:
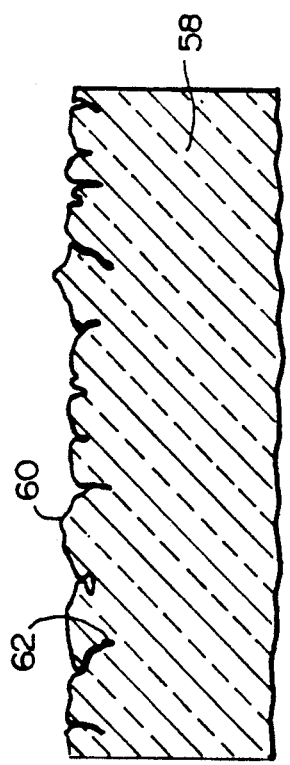
FIG. 2a is an illustration of a fused silica starting surface ground using 30 micro grit loose abrasive.
Figure 2B:
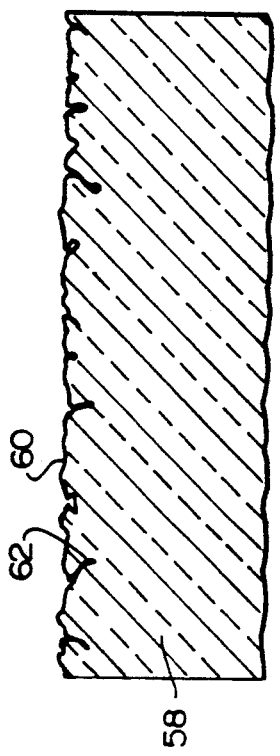
FIG. 2b is an illustration of the same fused silica processed with the plasma assisted chemical etching method of the present invention to a removal depth of 5 microns.
Figure 2C:
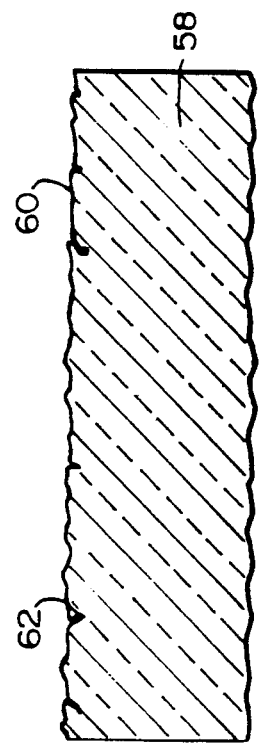
FIG. 2c is an illustration of the same fused silica processed with the plasma assisted chemical etching method of the present invention to a removal depth of 20 microns.
Figure 2D:
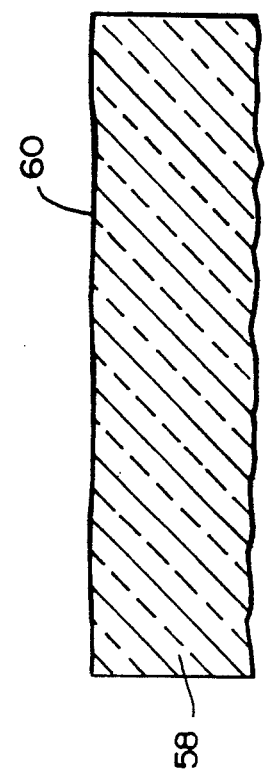
FIG. 2d is an illustration of the same fused silica processed with the plasma assisted chemical etching method if the present invention to a removal depth of 170 microns.

FIGS. 2a through 2d are illustrations of the surface of a thick silicon dioxide substrate 58 previously polished with a loose abrasive as it undergoes the subsurface damage removal process of the present invention. More particularly, FIG. 2a is an illustration of a thick silicon dioxide substrate having a surface 60 that exhibits a substantial number of microcracks 62. This illustration is typical of such a surface 60 subsequent to a mechanical abrasive grinding with 30 micro grit loose abrasive. FIG. 2b is the same surface 60 as it may appear with 5 microns of material removed according to the present invention. FIG. 2c is the same surface 60 as it may appear with 20 microns of material removed according to the present invention. FIG. 2d is the same surface 60 as it may appear with 170 microns of material removed according to the present invention. Generally, when a rough surface is produced by any mechanical abrasive process, such as polishing, sawing, or grinding, subsurface damage in the form of microcracks extend into the surface up to a depth of several times the peak to valley height of the surface roughness. Subsurface damage removal occurs by rapidly smoothing surface roughness and by exposing the microcracks which are subsequently smoothed by continued material removal. The present invention can also be used with other substrate materials such as silicon and germanium.

Figure 3:
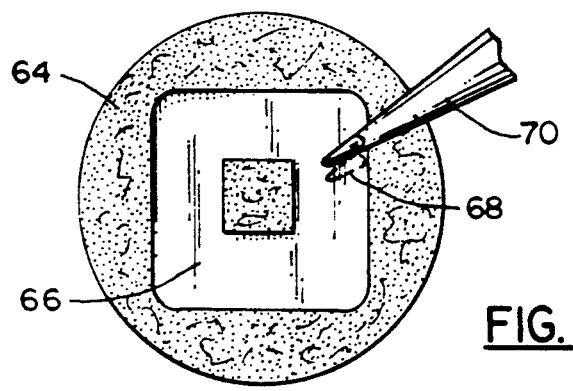
FIG. 3 is a photograph of a rough ground silicon surface after subsurface damage has been removed and surface smoothed over a square path by a small confined plasma of the present invention along the path.

FIG. 3 illustrates removal of subsurface damage and the smoothing of a rough ground silicon surface 64 over a square path 66 by a confined plasma. When mechanical processing of the surface is performed prior to subsurface damage removal by plasma etching, there is a trade-off between the depth of damage introduced by the mechanical polishing tool and the depth of plasma removal required to obtain a smooth, damage-free surface. As shown in FIG. 3 the square path 66 formed by the confined plasma is finished to such a smoothness that it is specular, i.e., the reflection 68 of an object 70 is readily visible. As shown by FIG. 2, the plasma etch removal first opens up the subsurface damage, microcracks and subsequently, by a differential etch rate between the resulting peaks and valleys, smooths the surface. A plasma etch removal depth of 10 times the initial subsurface damage depth may be required to give a highly smooth surface. Consequently, it may be beneficial to follow a mechanical process which leaves deep subsurface damage, such as saw cutting, by a further mechanical process, or processes, such as a loose abrasive grind, that can rapidly reduce the depth of the subsurface damage although not eliminating the damage layer.

To uniformly remove material at a high rate over an entire substrate surface so as to provide a means for rapidly processing a large number of finished wafers, the apparatus of the present invention utilizes a plasma reactor chamber 14 large enough to enclose the surface of the substrate. On the other hand, when a very uniform removal is required (i.e., thickness uniformity less than 5%) or a specific thickness profile across the substrate surface is desired, the apparatus of the present invention utilizes a plasma chamber 14 size smaller than the entire substrate surface. The use of a small chamber provides a small confined plasma which may be scanned over the substrate surface in a programmed manner to yield the desired removal profile. When a prescribed depth profile is desired, the size of the reactor depends on a representative dimension of the spatial variation in the depth profile.

Thus, controlled material removal, when using either a large plasma reactor enclosing the substrate surface or a small reactor scanned over the substrate surface, requires confinement of the plasma. Downstream reactor configurations in which long lived, chemically reactive and excited neutral species flow out of the plasma generation region to the substrate surface described in above referenced U.S. patent application Ser. No. 07/807,536, can also be used to confine the plasma.

Thus, what has been described is a method and apparatus for removing subsurface damage from a substrate with a non-contact high-pressure plasma assisted chemical etching material removal tool which limits ion energy bombardment of the substrate so as to substantially eliminate the introduction of new microscopic and atomic subsurface damage.

What is claimed is:

1. A material removal tool for performing plasma assisted chemical etching reactions on the surface of a substrate so as to remove subsurface damage thereon, said tool comprising a reactor having:

means for generating a local plasma etching reaction at a localized region of the substrate, said means including, means for defining a plasma chamber cavity as well as means for supplying a process gas to the plasma chamber cavity at a pressure greater than 1 Torr and for supplying rf power to said process gas within the plasma chamber cavity so as to cause said gas to disassociate into a reactive plasma;

means for surrounding an outer periphery of the plasma chamber cavity so as to suppress plasma generation outside of said plasma chamber cavity; and means for adjusting the position of said plasma chamber cavity with respect to said substrate so as to position the local plasma etching reaction over a localized region of the substrate.

2. The material removal tool of claim 1, wherein the means for supplying rf power includes a first electrode positioned within the plasma chamber cavity, and a second electrode positioned outside the plasma chamber cavity so that the substrate is positioned between the first and second electrodes so as to complete an electrical circuit for supplying rf power to the reactive gas within the plasma chamber cavity.

3. The material removal tool of claim 1, wherein the means for defining a plasma chamber cavity include a first dielectric insulator.

4. The material removal tool of claim 3, wherein the first dielectric insulator is preferably fabricated from a non-contaminating dielectric material.

5. The material removal tool of claim 1, wherein the means for supplying a reactive gas to the plasma chamber cavity includes an electrically conductive and porous gas diffuser.

6. The material removal tool of claim 1, wherein the means for surrounding the outer periphery of the plasma chamber cavity is a second dielectric insulator extending outward from the first dielectric insulator so as to insulate conductive and proximate surfaces, and thereby facilitate extinction of any plasma outside the plasma chamber cavity.

7. The material removal tool of claim 1, wherein the means for adjusting the position of said plasma chamber cavity with respect to said substrate is an X-Y positioning table.

8. A material removal tool for performing plasma assisted chemical etching reactions on the surface of a substrate so as to remove subsurface damage thereon, said tool comprising a reactor having:

a housing;

a first dielectric insulator positioned within the housing for defining a plasma chamber having a cavity for performing a local plasma etching reaction about a localized region of a substrate;

means for supplying the plasma chamber with a flow of process gas;

means for providing the process gas within the plasma chamber at a pressure greater than 1 Torr with rf power so as to generate a plasma therein;

a second dielectric insulator positioned within the housing and around the first dielectric insulator, said second dielectric insulator extending outward from the first dielectric insulator so as to insulate conductive and proximate surfaces, and thereby facilitating extinction of any plasma outside the plasma chamber cavity;

means for supporting the substrate; and means for adjusting the position of said plasma chamber with respect to said substrate surface.

9. The material removal tool of claim 8, wherein the means for supplying rf power includes a first electrode positioned within the plasma chamber cavity, an electrically conductive rf gas diffuser, and a second electrode positioned outside the plasma chamber cavity so that the substrate is positioned between the first and second electrodes so as to complete an electrical circuit for supplying rf power to the reactive gas within the plasma chamber cavity.

10. The material removal tool of claim 9, wherein the first electrode having upper and lower surfaces is positioned so that the upper surface is in contact with the ceiling surface of the plasma chamber cavity and the rf gas diffuser, having an upper and lower surface is positioned so that its upper surface is in contact with the lower surface of the first electrode.

11. The material removal tool of claim 10, wherein the upper and lower surface areas of the first electrode have approximately the same area and approximately the same planar geometry as the surface of the ceiling of the plasma chamber cavity.

12. The material removal tool of claim 10, wherein the upper and lower surface areas of the electrically conductive gas diffuser have approximately the same area and approximately the same planar geometry as the surface of the ceiling of the plasma chamber cavity.

13. The material removal tool of claim 9, wherein the electrically conductive gas diffuser is fabricated from porous silicon carbide.

14. The material removal tool of claim 9, wherein the electrically conductive gas diffuser is fabricated from graphite.

15. The material removal tool of claim 9, wherein the second electrode is maintained at substantially at ground potential.

16. The material removal tool of claim 8, wherein the means for adjusting the position of said plasma chamber with respect to said substrate surface in the orthogonal direction comprises an x-y positioning table.

17. The material removal tool of claim 8, wherein said housing includes means for applying a vacuum to the housing to remove reaction product and exces reactive gas.

18. The material removal tool of claim 8, further comprising extending the first dielectric insulator defining the walls of said plasma chamber cavity a predetermined amount beyond the surface of the second dielectric proximate to the substrate surface so as to create a region of high plasma and low reactive gas flow conductance circumferentially adjacent to a site where plasma etching is occurring.

19. A material removal tool for performing confined plasma assisted chemical etching reactions on the surface of a substrate comprising a reactor having:

a housing means for carrying out a local plasma etching reaction including means for controlling the temperature and pressure of the environment within the housing;

a first dielectric insulator positioned within the housing for defining a plasma chamber having a cavity for performing a local plasma etching reaction about a localized region of a substrate;

means for supplying the plasma chamber with a flow of process gas including a gas diffuser;

means for providing the process gas within the plasma chamber at a pressure greater than 1 Torr with rf power so as to generate a plasma therein, said means including a first electrode positioned within the plasma chamber cavity, an electrically conductive rf gas diffuser, and a second electrode positioned outside the plasma chamber cavity so that the substrate is positioned between the first and second electrodes so as to complete an electrical circuit for supplying rf power to the reactive gas within the plasma chamber cavity;

a second dielectric insulator positioned within the housing and around the first dielectric insulator, said second dielectric insulator extending outward from the first dielectric insulator so as to insulate conductive and proximate surfaces, and thereby facilitating extinction of any plasma outside the plasma chamber cavity, and extending downward toward the substrate surface a distance shorter than the first dielectric insulator so as to allow the first dielectric insulator to create a region of high plasma and reactive flow impedance circumferentially adjacent to a site where plasma etching is occurring so that plasma outside the region is extinguished;

means for supporting the substrate; and an X-Y positioning table means for adjusting the position of said substrate surface with respect to the plasma chamber in an orthogonal direction.

20. A method for removing the subsurface damage of a substrate comprising the steps of:

mounting an etchable substrate surface to an electrode;

positioning a plasma etching chamber over the surface of the substrate, the precise position of the chamber and dwell time thereof being dictated by the damage removal desired;

feeding a process gas stream into a feed inlet of an rf driven diffuser in said plasma etching chamber so that the pressure of said process gas in said plasma chamber is greater than 1 Torr;

applying rf power to an electrode within the plasma chamber to create an rf electric field within the plasma chamber for disassociating the process gas into component ions, electrons, neutral atoms and molecules; and controlling the area of subsurface damage removal by relative movement between the substrate and plasma chamber.

21. The method of claim 20, wherein the area and the profile of etching is controlled by moving the substrate in two or more directions with respect to a fixed plasma chamber.

22. The method of claim 20, wherein the area and profile of etching is controlled by moving the plasma chamber in two or more directions with respect to a fixed substrate.

23. The method of claim 20, wherein an etched void having approximately vertical and perpendicular walls with respect to the substrate surface is fabricated by positioning the plasma chamber closer than a sheath width to the surface of the etchable substrate.

24. The method of claim 20, wherein an etched void having sloping walls is fabricated by positioning the plasma chamber further than a sheath width to the surface of the etchable substrate.

25. The method of claim 20, wherein the reactive gas has high electronegativity.

26. The method of claim 25, wherein the reactive gas is sulfur hexafluoride.

27. The method of claim 25, wherein the reactive gas is nitrogen trifluoride.

* * * * *